US010395896B2

(12) United States Patent
Lee et al.

(10) Patent No.: US 10,395,896 B2
(45) Date of Patent: Aug. 27, 2019

(54) METHOD AND APPARATUS FOR ION ENERGY DISTRIBUTION MANIPULATION FOR PLASMA PROCESSING CHAMBERS THAT ALLOWS ION ENERGY BOOSTING THROUGH AMPLITUDE MODULATION

(71) Applicant: APPLIED MATERIALS, INC., Santa Clara, CA (US)

(72) Inventors: Wonseok Lee, Saratoga, CA (US); Kartik Ramaswamy, San Jose, CA (US); Ankur Agarwal, Mountain View, CA (US); Haitao Wang, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/449,456

(22) Filed: Mar. 3, 2017

(65) Prior Publication Data
US 2018/0254171 A1    Sep. 6, 2018

(51) Int. Cl.
| | |
|---|---|
| *H01J 37/32* | (2006.01) |
| *H01L 21/02* | (2006.01) |
| *H01L 21/3213* | (2006.01) |
| *H01L 21/683* | (2006.01) |
| *H01L 21/67* | (2006.01) |
| *H01L 21/3065* | (2006.01) |

(52) U.S. Cl.
CPC .. *H01J 37/32165* (2013.01); *H01J 37/32082* (2013.01); *H01J 37/32091* (2013.01); *H01J 37/32183* (2013.01); *H01J 37/32577* (2013.01); *H01J 37/32697* (2013.01); *H01J 37/32935* (2013.01); *H01L 21/02274* (2013.01); *H01L 21/3065* (2013.01); *H01L 21/32136* (2013.01); *H01L 21/67069* (2013.01); *H01L 21/6831* (2013.01); *H01L 21/6833* (2013.01); *H01J 2237/334* (2013.01)

(58) Field of Classification Search
None
See application file for complete search history.

(56) References Cited

U.S. PATENT DOCUMENTS

| | | |
|---|---|---|
| 4,579,618 A | 4/1986 | Celestino et al. |
| 6,089,181 A | 7/2000 | Suemasa et al. |

(Continued)

OTHER PUBLICATIONS

International Search Report and Written Opinion dated Jun. 12, 2018 received for PCT Application No. PCT/US2018/019928.

*Primary Examiner* — Jiong-Ping Lu
(74) *Attorney, Agent, or Firm* — Moser Taboada; Alan Taboada

(57) ABSTRACT

Methods and apparatus for boosting ion energies are contemplated herein. In one embodiment, the methods and apparatus comprises a controller, a process chamber with a symmetrical plasma source configured to process a wafer, one or more very high frequency (VHF) sources, coupled to the process chamber, to generate plasma density and two or more frequency generators that generate low frequencies relative to the one or more VHF sources, coupled to a bottom electrode of the process chamber, the two or more low frequency generators configured to dissipate energy in the plasma sheath, wherein the controller controls the one or more VHF sources to generate a VHF signal and the two or more low frequency sources to generate two or more low frequency signals.

20 Claims, 7 Drawing Sheets

(56) References Cited

U.S. PATENT DOCUMENTS

| | | |
|---|---|---|
| 6,642,149 B2 | 11/2003 | Suemasa et al. |
| 6,645,870 B2 | 11/2003 | Negishi et al. |
| 6,706,138 B2 | 3/2004 | Barnes et al. |
| 6,841,943 B2 | 1/2005 | Vahedi et al. |
| 6,849,154 B2 | 2/2005 | Nagahata et al. |
| 7,144,521 B2 | 12/2006 | Rusu et al. |
| 7,169,256 B2 | 1/2007 | Dhindsa et al. |
| 7,326,872 B2 | 2/2008 | Shannon |
| 7,359,177 B2 | 4/2008 | Yang et al. |
| 7,375,947 B2 | 5/2008 | Yang et al. |
| 7,405,521 B2 | 7/2008 | Dhindsa et al. |
| 7,431,857 B2 | 10/2008 | Shannon et al. |
| 7,503,996 B2 | 3/2009 | Chen et al. |
| 7,510,665 B2 | 3/2009 | Shannon et al. |
| 7,541,289 B2 | 6/2009 | Brown et al. |
| 7,625,460 B2 | 12/2009 | Howard |
| 7,645,357 B2 | 1/2010 | Paterson et al. |
| 7,682,483 B2 | 3/2010 | Xia |
| 7,695,633 B2 | 4/2010 | Holland |
| 7,695,983 B2 | 4/2010 | Hoffman |
| 7,736,914 B2 | 6/2010 | Liu et al. |
| 7,749,353 B2 | 7/2010 | Rusu et al. |
| 7,812,278 B2 | 10/2010 | Shannon |
| 7,820,020 B2 | 10/2010 | Brown et al. |
| 7,838,430 B2 | 11/2010 | Shannon et al. |
| 7,868,556 B2 | 1/2011 | Xia |
| 7,879,185 B2 | 2/2011 | Shannon et al. |
| 7,879,731 B2 | 2/2011 | Collins et al. |
| 7,884,025 B2 | 2/2011 | Collins et al. |
| 7,968,469 B2 | 6/2011 | Collins et al. |
| 7,994,872 B2 | 8/2011 | Shannon et al. |
| 8,017,526 B2 | 9/2011 | Hammond, IV et al. |
| 8,043,981 B2 | 10/2011 | Ma et al. |
| 8,076,247 B2 | 12/2011 | Collins et al. |
| 8,080,479 B2 | 12/2011 | Collins et al. |
| 8,237,517 B2 | 8/2012 | Shannon et al. |
| 8,299,391 B2 | 10/2012 | Todorow et al. |
| 8,366,829 B2 | 2/2013 | Yin et al. |
| 8,877,081 B2 | 11/2014 | Nishimura et al. |
| 8,920,611 B2 | 12/2014 | Forster et al. |
| 8,974,684 B2 | 3/2015 | Banna et al. |
| 9,082,590 B2 | 7/2015 | Carducci et al. |
| 9,275,836 B2 | 3/2016 | Himori |
| 9,299,580 B2 | 3/2016 | Kong et al. |
| 9,449,794 B2 | 9/2016 | Nguyen et al. |
| 2004/0025791 A1 | 2/2004 | Chen et al. |
| 2004/0027209 A1 | 2/2004 | Chen et al. |
| 2005/0217795 A1 | 10/2005 | Avoyan et al. |
| 2006/0175015 A1 | 8/2006 | Chen et al. |
| 2008/0190893 A1* | 8/2008 | Mori ............... C23F 4/00 216/61 |
| 2008/0203056 A1 | 8/2008 | Wang et al. |
| 2009/0004873 A1 | 1/2009 | Yang et al. |
| 2013/0213935 A1 | 8/2013 | Liao et al. |
| 2014/0020835 A1 | 1/2014 | Nguyen et al. |
| 2014/0020836 A1 | 1/2014 | Nguyen et al. |
| 2014/0020837 A1 | 1/2014 | Nguyen et al. |
| 2014/0020838 A1 | 1/2014 | Kenney et al. |
| 2014/0020839 A1 | 1/2014 | Kenny et al. |
| 2014/0034612 A1* | 2/2014 | Yang ............... H01J 37/32082 216/71 |
| 2014/0320016 A1* | 10/2014 | Chang ............... H01J 37/32082 315/111.41 |
| 2015/0024515 A1 | 1/2015 | Hoffman et al. |
| 2015/0075719 A1 | 3/2015 | Ramaswamy et al. |
| 2015/0243486 A1 | 8/2015 | Yokogawa et al. |

\* cited by examiner

METHOD AND APPARATUS FOR ION ENERGY DISTRIBUTION MANIPULATION FOR PLASMA PROCESSING CHAMBERS THAT ALLOWS ION ENERGY BOOSTING THROUGH AMPLITUDE MODULATION

FIELD

Embodiments disclosed herein generally relate to a method and apparatus for plasma-assisted substrate processing techniques.

BACKGROUND

In the semiconductor manufacturing industry, the size of features etched on substrates, such as semiconductor wafers, continues to decrease and transistor structures are becomes increasingly complex. For example, there is a growing trend of forming a chain of transistors vertically instead of laterally, as is the case in vertical NAND memory structures. These vertical structures come with their own unique challenges because very high aspect ratio holes must be made in order to make contacts or deep trenches so that the infrastructure for electrical pathways can be laid.

The etching of these high aspect ratio holes calls for the use of high ion energies in an abundant supply (ion flux). It is important that the holes do not bend or twist while etching and that the holes maintain consistency even when the holes become deeper without significant loss of etch rate. Solutions that are typically employed have several problems. First, existing solutions often apply frequencies to the same driven electrode closely couples ion energies and ion flux by influencing the plasma sheath. As a practical problem coupling all frequencies to the same driven electrode requires higher and higher low frequency power (responsible for ion energies) when higher flux (higher VHF) is required. The second problem with existing technologies is that the thermal burden on the transmission lines to the chamber and wafer carrying substrate is excessive.

Therefore, the inventors have provided methods and apparatus for plasma processing that decouple the ion energies and the ion flux and that reduce the thermal burden on transmission lines in plasma processing.

SUMMARY

Methods and apparatus for plasma processing using low frequency ion energy boosting are provided herein. In some embodiments, an apparatus for boosting ion energy includes a controller, a process chamber with a symmetrical plasma source configured to process a substrate (e.g., a wafer), one or more very high frequency (VHF) sources, coupled to the process chamber, to generate plasma density and two or more frequency generators that generate low frequencies relative to the one or more VHF sources, coupled to a bottom electrode of the process chamber, the two or more low frequency generators configured to dissipate energy in the plasma sheath, wherein the controller controls the one or more VHF sources to generate a VHF signal and the two or more low frequency sources to generate two or more low frequency signals.

In other embodiments, a method for plasma processing using low frequency ion energy boosting comprises processing a wafer using a symmetrical plasma source in a process chamber, providing two or more frequencies less than a predetermined threshold for dissipating energy in a plasma sheath, the frequencies provided to a bottom electrode of the process chamber, providing one or more flux generating frequencies to the symmetrical plasma source, and providing a low impedance DC ground for bias frequencies.

Other and further embodiments are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
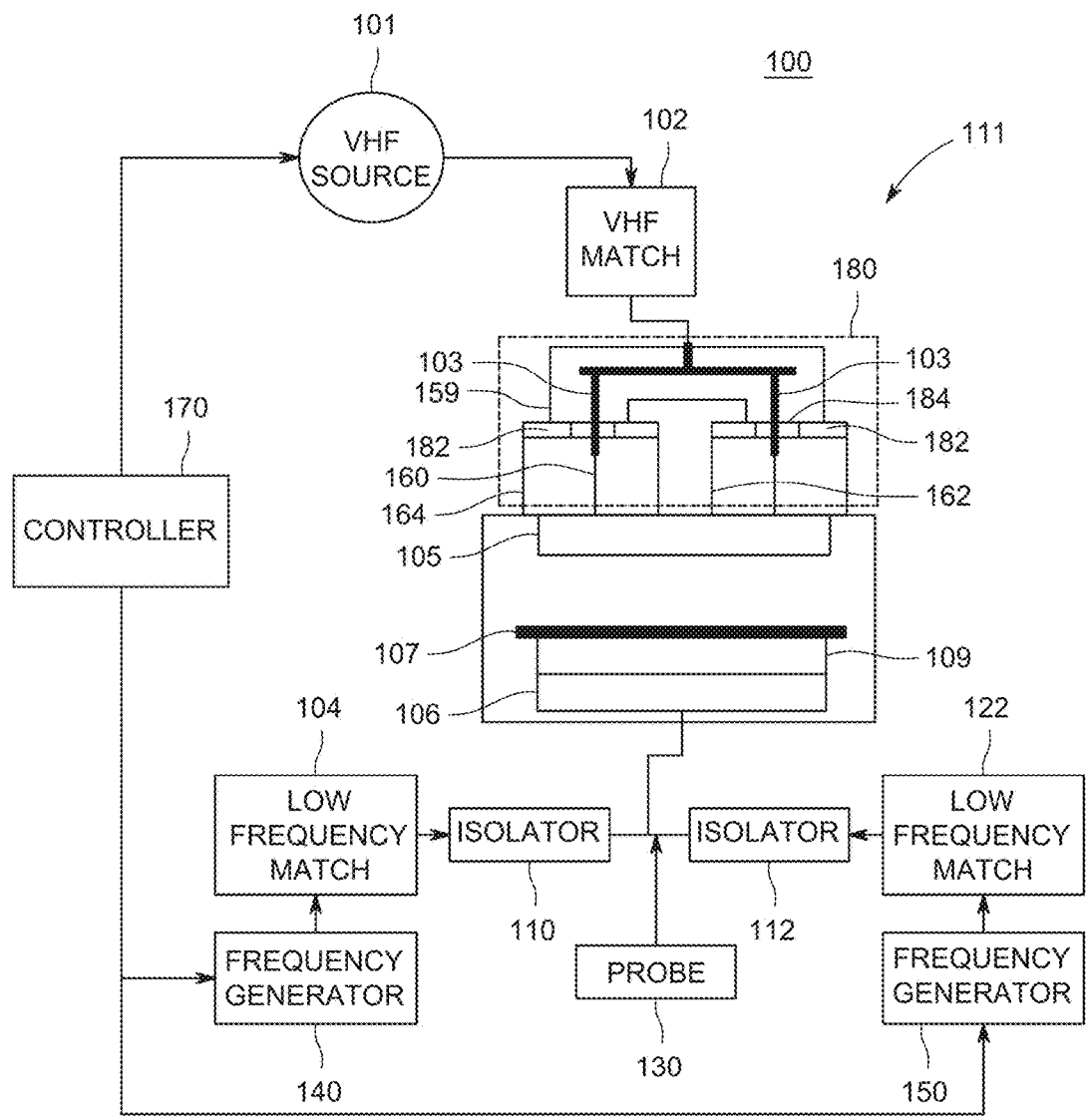
FIG. 1 is a block diagram of a process chamber for boosting ion energies in accordance with exemplary embodiments disclosed herein.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method and apparatus for ion energy boosting are provided herein. According to one embodiment, an apparatus for processing substrates, such as semiconductor wafers, is provided. The apparatus comprises a symmetrical VHF plasma source coupled to a top electrode and a bottom electrode coupled to two or more low frequency sources that dissipate power in the plasma sheath rather than the bulk plasma. The two or more low frequencies are selected such that they provide sufficient amplitude modulation, e.g., a modulation depth of 0.2 or more but less than 1 to provide higher peak to peak voltages when these two low frequencies are used in combination, rather than low frequencies individually. The symmetrical VHF plasma source provides low impedance return through a top electrode for the low frequencies applied to the bottom electrode, while the top electrode is RF hot in order for the one or more VHF frequencies to generate plasma density. The low impedance ground of the top electrode allows the bias currents to return back to the low frequency generators In some embodiments, a process chamber further comprises an auxiliary electrode that is sensitive to the VHF applied to the top electrode, or that is sensitive to resonant frequencies of the two or more low frequencies applied to the bottom electrode.

FIG. 1 is a block diagram of an apparatus 100 for boosting ion energies in accordance with exemplary embodiments.

The apparatus 100 comprises a VHF source 101, a VHF match 102, a process chamber 111, a first frequency generator 140, a second frequency generator 150, a first low frequency match 104, a second low frequency match 122, a first isolator 110, a second isolator 112 and a controller 170. In some embodiments, a high voltage (HV) probe 130 is coupled to the bottom to the bottom electrode 106.

The process chamber 111 comprises one or more symmetrical conductors 103, a top electrode 105, a bottom electrode 106, an electrostatic chuck 109 for supporting a wafer 107.

The VHF source 101 generates a very high frequency (VHF) signal approximately greater than 30 MHz and approximately less than 300 MHz. The VHF source 101 is coupled to a VHF match 102 via a transmission line. The VHF match 102 is an impedance matching circuit which matches the impedance of the VHF source 101 with the impedance of the load, e.g., the process chamber 111 in order to maintain maximum power transfer over the transmission line. The VHF source 101 is responsible for increasing plasma density and, therefore inducing ion flux in the process chamber 111. In some embodiments, there is more than one VHF source coupled to the process chamber 111. In such embodiments, each VHF source is coupled to a respective matching circuit, the output of which is coupled to the process chamber 111.

The process chamber 111 contains a symmetrical plasma source, i.e., a plurality of symmetrical conductors collectively referred to as symmetrical conductors 103 which deliver RF power to the top electrode 105 in a uniform symmetrical manner. The symmetrical conductors 103 are contained within a hollow cylinder 159. The hollow cylinder 159 is connected to the RF power delivery apparatus 180, consisting of a plurality of cylindrical metal structures (at least three). In the example of three hollow cylinders, the center cylinder 160 and the inner cylinder 162 are connected to each other and the top electrode 105 at the top electrode 105. The inner cylinder 162 is connected on the top to the outer cylinder 164 by an annular ring 182. The symmetrical conductors 103 are connected to the center cylinder 160 through an aperture hole 184 in the annular ring 182. Since all the cylinders are all connected to the chamber ground, the top electrode 105 is connected to the chamber ground which is at DC potential providing a low impedance bias current return.

The symmetrical conductors 103 therefore act as a low impedance ground return for low frequency signals generated by the first frequency generator 140 and the second frequency generator 150. The top electrode 105 is DC grounded to the process chamber 111 via the cylinders, and thus also acts as a good low impedance return for low frequencies.

The wafer 107 to be processed is supported by an electrostatic chuck 109. The bottom electrode 106 is below the electrostatic chuck 109 and is coupled to the first frequency generator 140 via the first isolator 110 and the first low frequency match 104. The bottom electrode 106 is also coupled to the second frequency generator 150 via the second isolator 112 and the second low frequency match 122.

The first low frequency match 104 and the second low frequency match 122 are impedance matching circuits that match the impedance of the first frequency generator 140 and the second frequency generator 150, respectively, with the load impedance. The first low frequency match 104 and the second low frequency match 122 are selected in order to correspond with the frequency of the generator they are coupled to. In an embodiment, for example, the first low frequency match 104 will be a 2 MHz match when the first frequency generator 140 is a 2 MHz frequency signal generator. Similarly, the second low frequency match 122 will be a 400 kHz match when the second frequency generator 150 is a 400 kHz frequency signal generator.

The first isolator 110 and the second isolator 112 are selected to remove all other frequency signals (reflected signals) except the signal being supplied to the isolators directly. For example, if the first frequency generator 140 generates a 2 MHz signal, and the second frequency generator 150 generates a 400 kHz signal, the first isolator 110 will be a 400 kHz RF isolator coupled to a 2 MHz frequency generator via a 2 MHz match, while the second isolator 112 will be a 2 MHz isolator coupled to a 400 kHz frequency generator via a 400 kHz match. The isolated signals from the first isolator 110 and the second isolator 112 are then coupled to the bottom electrode 106.

According to exemplary embodiments, the probe 130 is a high voltage probe for measuring voltage at the bottom electrode 106. In embodiments where more than two low frequency signals are supplied to the bottom electrode 106, an equivalent number of isolators (selected for corresponding frequencies) and an equivalent number of low frequency impedance matches (selected for corresponding frequencies) are used.

The controller 170 controls the very high frequency signals generated by the VHF source 101 and the low frequencies generated by the first frequency generator 140 and the second frequency generator 150.

According to embodiments, the frequencies generated by the first frequency generator 140 and the second frequency generator 150 are at least an order of magnitude smaller than the frequency of the signal generated by VHF source 101. In some embodiments, there are more than two frequency generators, thus allowing two or more low frequency voltages to be coupled to the bottom electrode 106.

In some embodiments, the first frequency generator 140 and the second frequency generator 150 generate a signal (waveform) with a frequency that is less than 4 MHz. According to one configuration in the embodiment, the first frequency generator 140 generates a signal with a frequency of 2 MHz, while the second frequency generator 150 generates a signal with a frequency of 400 kHz. In other embodiments, the frequencies may be the same, or may be harmonics of each other. In the case of harmonics (e.g. the 2 MHz frequency is a $5^{th}$ harmonic of the 400 kHz frequency), phase coherence between both low frequencies becomes an additional adjustment point used to manipulate ion energies.

The choice of two or more low frequencies less than 4 MHz strongly amplitudes the lower frequency waveform. For example, the 2 MHz signal will strongly amplitude modulate the lower frequency of 400 Khz, resulting in significantly higher peak voltages on the plasma sheath, and therefore higher ion energies, when compared to low frequency waveforms operating at the same power with low peak voltages. The choice of the frequencies generated by the first frequency generator 140 and the second frequency generator 150 are such that they provide sufficient amplitude modulation to provide higher peak to peak voltages when used in combination, in contrast to using low frequency signals individually.

Figure 5:
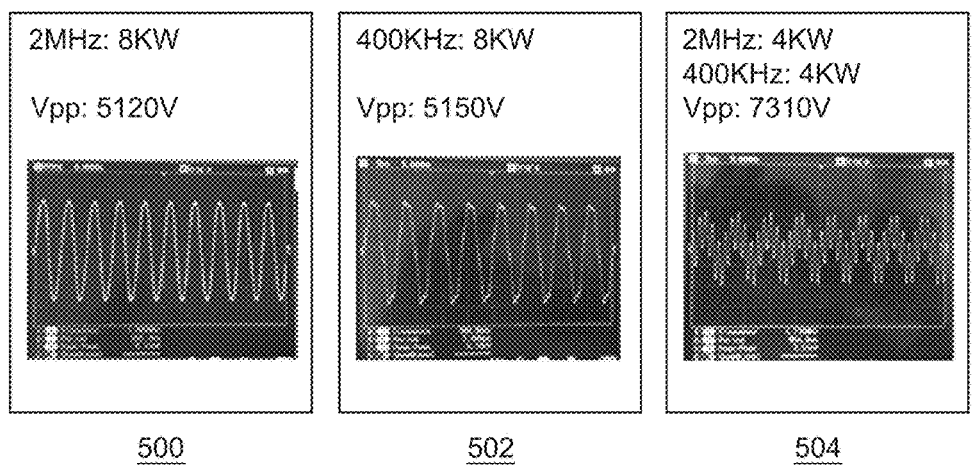
FIG. 5 depicts several waveforms that can be provided to process chambers disclosed herein.

FIG. 5 illustrates waveforms at various frequencies as measured by probe 130. Plot 500 illustrates a waveform at a 2 MHz frequency generating 8 KW of power. Plot 502 illustrates a waveform at a 400 kHz frequency generating 8 KW of power. Finally, plot 504 illustrates a measurement by probe 130, where 2 MHz frequency signal amplitude modulates the 400 kHz signal, each signal having a reduced power of 4 kW, and a peak voltage of 7.310 kV, greater than the individual peak voltages shown in plot 500 and 502, or higher voltage for the same power.

Figure 6:
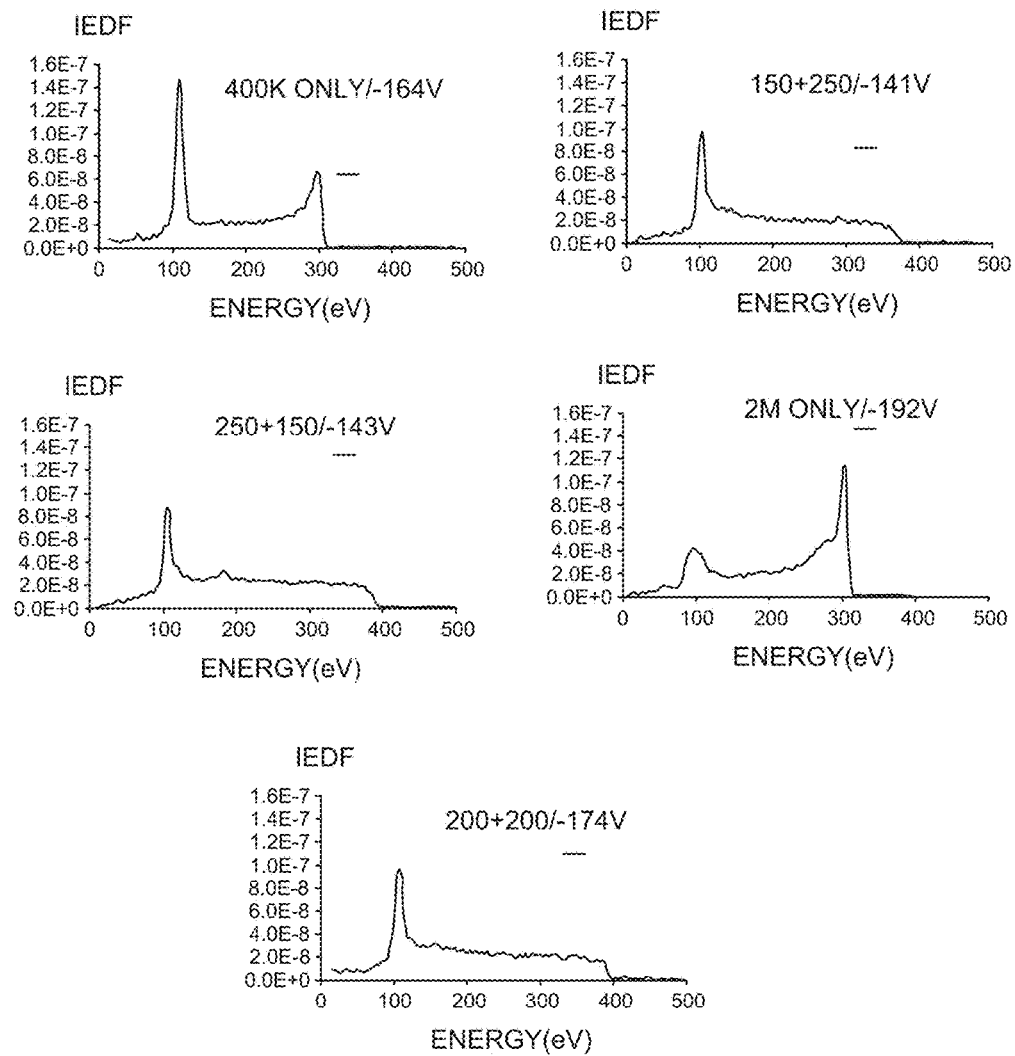
FIG. 6 depicts ion energy distributions according to exemplary embodiments disclosed herein.

FIG. 6 depicts ion energy distributions according to exemplary embodiments. The "energy boost" attained by the use of two or more low frequency signals coupled to the bottom electrode while a VHF signal is coupled to the top electrode is illustrated along with single frequency non-modulated signals.

The signals at these frequencies are responsible for energy dissipation in the plasma sheath that is formed on top of the wafer carrying bottom electrode 106. Frequencies below 4 MHz are deliberately chosen in the embodiment as they are inefficient in plasma generation, and operate on the plasma sheath, a high impedance load on top of the bottom electrode 106. Thus, the frequencies below 4 MHz dissipate power in the plasma sheath and generate high voltage sheaths.

According to the embodiment, the VHF source 101 is decoupled from the low frequency signals generated by the first frequency generator 140 and the second frequency generator 150 since the VHF and low frequency signals are applied to different electrodes and the frequency separation is large. For example, the frequency separation is at least greater than or equal to 30 MHz. The power requirement to make high voltages is significantly reduced from configurations where both the low and the VHF signals are coupled to the same electrode. Consequently, the thermal burden on the transmission lines delivering the power is also significantly reduced in comparison to the single electrode example.

Figure 2:
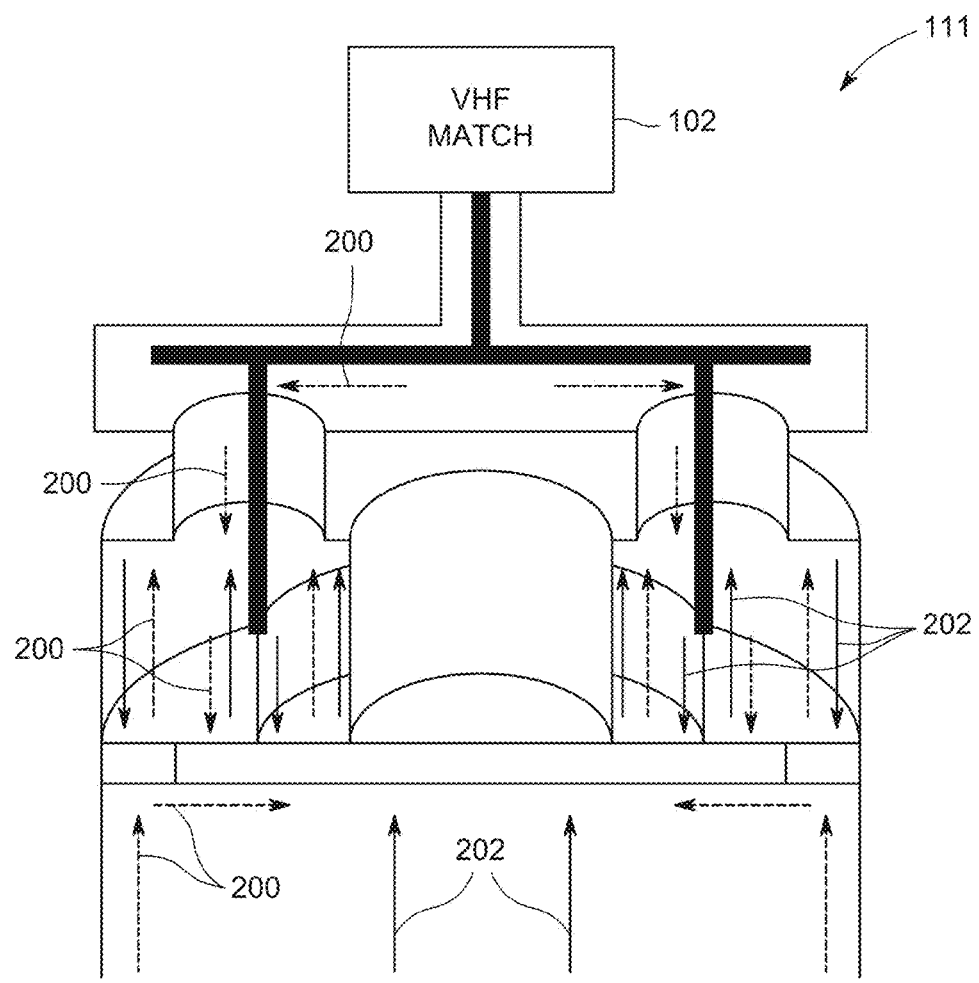
FIG. 2 is a more detailed block diagram of the upper portion of the process chamber of FIG. 1 in accordance with exemplary embodiments disclosed herein.

FIG. 2 is a more detailed block diagram of the upper portion of the process chamber 111 of FIG. 1 in accordance with exemplary embodiments.

The dashed arrows 200 illustrate the path of the VHF current. The solid arrows 202 indicate the current path of the signals generated by the first frequency generator 140 and the second frequency generator 150. Because the top electrode 105 is grounded, the current generated by the first frequency generator 140 can use the top electrode 105 using the solid arrow marks path and return back to the first frequency generator 140. Had the top electrode 105 not been grounded, the top electrode 105 would not have been in the primary path for the currents generated from the first frequency generator 140 to return to the first frequency generator 140 and uniformity would have been compromised In some embodiments, the process chamber 111 comprises gas conduits in the upper portion through the DC grounded top electrode.

Figure 3:
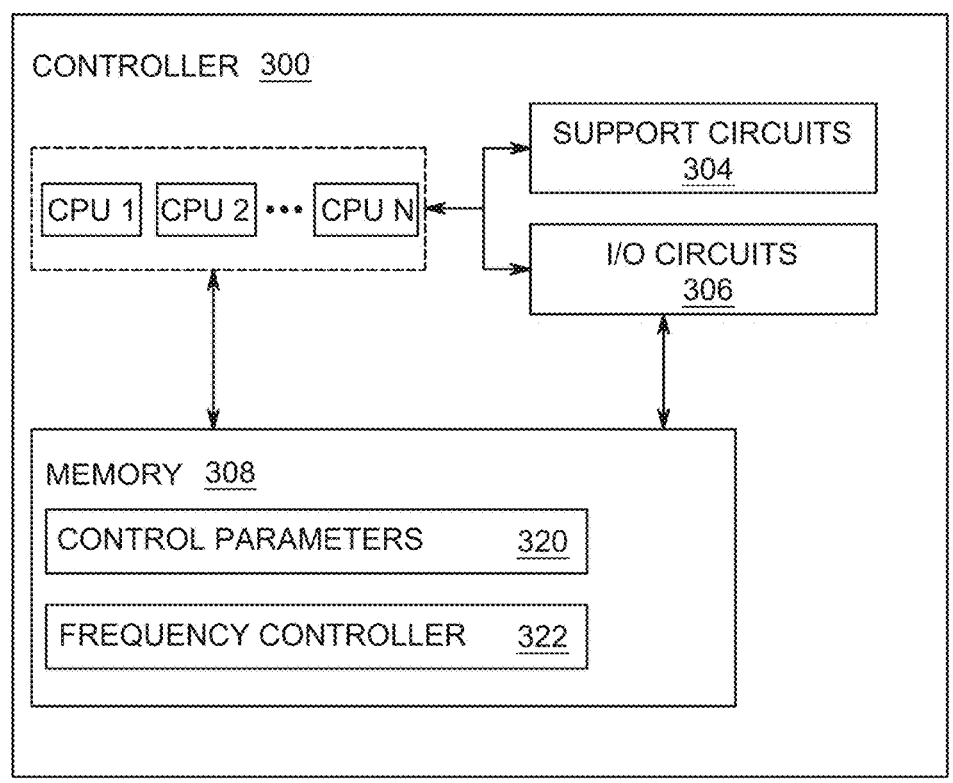
FIG. 3 is a block diagram of a controller in accordance with exemplary embodiments of the present disclosure.

FIG. 3 is a block diagram of a controller 300 in accordance with exemplary embodiments of the present disclosure.

Various embodiments of methods for boosting ion energies may be executed by the controller 300. Controller 300 is an exemplary embodiment of controller 170 of FIG. 1. According to one embodiment, the controller 300 comprises one or more CPUS 1 to N, support circuits 304, I/O circuits 306 and system memory 308. The system memory 308 may further comprise control parameters 320 and a frequency controller 322. The CPUs 1 to N are operative to execute one or more applications which reside in system memory 308. The controller 300 may be used to implement any other system, device, element, functionality or method of the embodiments described in this specification. In the illustrated embodiments, the controller 300 may be configured to implement method 400 (FIG. 4) as processor-executable executable program instructions. The frequency controller 322 controls the frequency of the signal generators in the apparatus 100 using control parameters 320, where the control parameters 320 contain at least one of one or more VHF frequencies, a first low frequency (relative to the VHF frequency), and a second low frequency (relative to the VHF frequency). In some embodiments, there are more than two low frequencies, and these frequencies are stored as control parameters 320.

In different embodiments, controller 300 may be any of various types of devices, including, but not limited to, a personal computer system, desktop computer, laptop, notebook, or netbook computer, mainframe computer system, handheld computer, workstation, network computer, a mobile device such as a smart phone or PDA, a consumer device, or in general any type of computing or electronic device.

In various embodiments, controller 300 may be a uniprocessor system including one processor, or a multiprocessor system including several processors (e.g., two, four, eight, or another suitable number). CPUs 1 to N may be any suitable processor capable of executing instructions. For example, in various embodiments CPUs 1 to N may be general-purpose or embedded processors implementing any of a variety of instruction set architectures (ISAs). In multiprocessor systems, each of CPUs 1 to N may commonly, but not necessarily, implement the same ISA.

System memory 308 may be configured to store program instructions and/or data accessible by CPUs 1 to N. In various embodiments, system memory 308 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 308. In other embodiments, program instructions and/or data may be received, sent or stored upon different types of computer-accessible media or on similar media separate from system memory 308 or controller 300.

In one embodiment, I/O circuits 306 may be configured to coordinate I/O traffic between CPUs 1 to N, system memory 308, and any peripheral devices in the device, including a network interface or other peripheral interfaces, such as input/output devices. In some embodiments, I/O circuits 306 may perform any necessary protocol, timing or other data transformations to convert data signals from one component (e.g., system memory 308) into a format suitable for use by another component (e.g., CPUs 1 to N). In some embodiments, I/O circuits 306 may include support for devices attached through various types of peripheral buses, such as a variant of the Peripheral Component Interconnect (PCI) bus standard or the Universal Serial Bus (USB) standard, for example. In some embodiments, the function of I/O circuits 306 may be split into two or more separate components, such as a north bridge and a south bridge, for example. Also, in some embodiments some or all of the functionality of I/O circuits 306, such as an interface to system memory 308, may be incorporated directly into CPUs 1 to N.

A network interface may be configured to allow data to be exchanged between controller 300 and other devices attached to a network, such as one or more display devices (not shown), or one or more external systems or between nodes. In various embodiments, a network may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, the network interface may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

Input/output devices may, in some embodiments, include one or more display terminals, keyboards, keypads, touchpads, scanning devices, voice or optical recognition devices, or any other devices suitable for entering or accessing data by one or more controller 300. Multiple input/output devices may be present or may be distributed on various nodes of controller 300. In some embodiments, similar input/output devices may be separate from biasing controller 300 and may interact with one or more nodes of controller 300 through a wired or wireless connection, such as over a network interface.

In some embodiments, the illustrated computer system may implement any of the methods described above, such as the methods illustrated by the flowcharts of FIG. 5. In other embodiments, different elements and data may be included.

Figure 4:
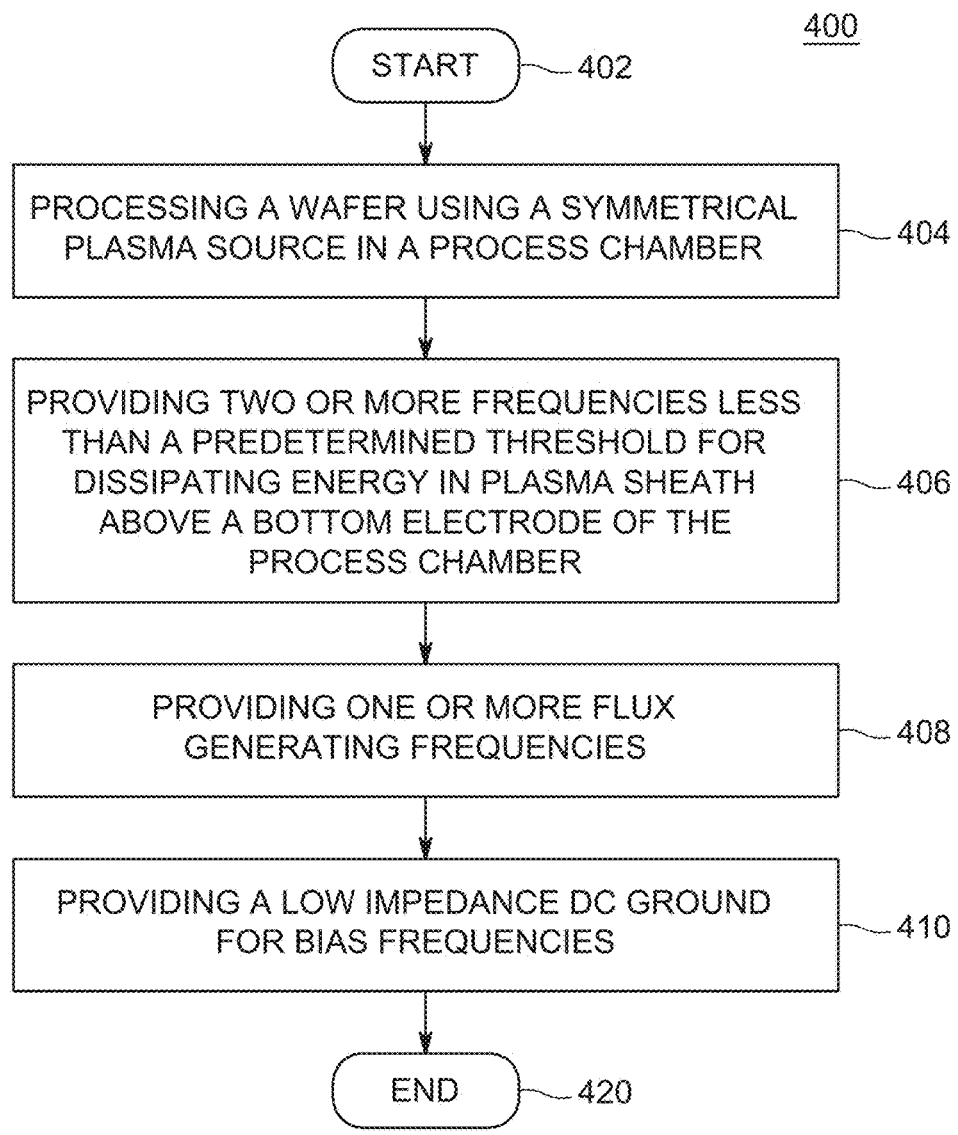
FIG. 4 is a flow diagram of a method for boosting ion energies in accordance with exemplary embodiments disclosed herein.

FIG. 4 is a flow diagram of a method 400 for boosting ion energies in plasma processing in accordance with exemplary embodiments.

The controller 300 is an exemplary implementation of the method 400 in accordance with exemplary embodiments of the present disclosure.

The method begins at 402 and proceeds to 404. At 404, the controller 300 controls a process chamber (e.g. process chamber 111) to process a wafer.

The method proceeds to 406, where the controller 300 controls two or more frequency generators to generate low frequency signals to dissipate energy in a plasma sheath above an electrode of the process chamber.

After 406, the proceeds to 408, where the controller 300 controls one or more VHF sources to generate a flux generating (or VHF) signal with a frequency above a predetermined threshold and coupling that signal to the symmetrical conductors in the plasma chamber.

The method 400 then proceeds to 410 where the controller 300 provides a low impedance DC ground for the bias frequency signals (e.g., the two or more low frequency signals). At 410, the method ends. Those of ordinary skill in the art will recognize that the above-described steps may or may be performed synchronously, asynchronously, or a combination of both, in order or simultaneously.

Figure 7:
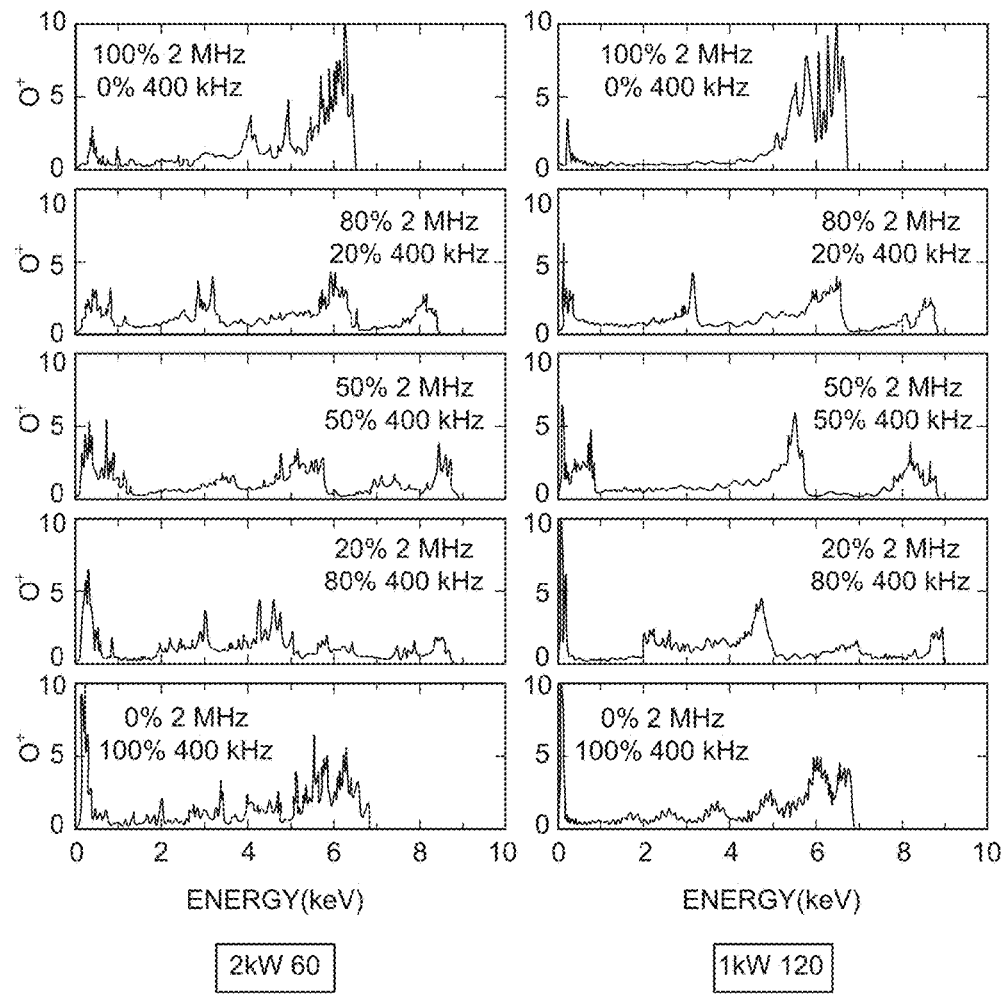
FIG. 7 illustrates multiple graphs of ion energy distributions in accordance with exemplary embodiments disclosed herein.

FIG. 7 illustrates multiple graphs of ion energy distributions in accordance with exemplary embodiments. The horizontal axis of each graph depicted represents ion energy up to 10 kEv, while the vertical axis represents ion amplitude in arbitrary units. As the ratio of 2 MHz and 400 kHz power is varied, the amplitude and ion energy are affected accordingly as shown in the graphs.

While the foregoing is directed to embodiments of the present disclosure, other and further embodiments of the disclosure may be devised without departing from the basic scope thereof.

The invention claimed is:

1. An apparatus for plasma processing, comprising:
a controller;
a process chamber with a symmetrical plasma source configured to process a wafer with a single monolithic top electrode, the single monolithic top electrode positioned centrally within the process chamber opposite a bottom electrode;
one or more very high frequency (VHF) sources, coupled to the single monolithic top electrode via symmetrical conductors connected to a top edge of a hollow cylinder which has a bottom edge connected to the single monolithic top electrode, to generate plasma density; and
two or more frequency generators that generate low frequencies relative to the one or more VHF sources, coupled to a bottom electrode of the process chamber, the two or more frequency generators configured to dissipate energy in a plasma sheath above the bottom electrode,
wherein the controller controls the one or more VHF sources to generate a VHF signal and the two or more frequency generators to generate two or more frequency signals, and
wherein the single monolithic top electrode is DC grounded to the process chamber such that a symmetrical low impedance current return path for the two or more frequency signals is provided by the symmetrical conductors.

2. The apparatus of claim 1, further comprising:
a VHF match configured to impedance match between the one or more VHF sources and the process chamber; and
two or more frequency matches configured to impedance match between the bottom electrode and the two or more frequency generators.

3. The apparatus of claim 2, further comprising:
two or more isolators configured to isolate the two or more frequencies, each isolator of the two or more isolators is positioned directly between one of the two or more low frequency matches and the bottom electrode.

4. The apparatus of claim 2, wherein the process chamber further comprises:
wherein the symmetrical conductors are coupled to the VHF match; and
an electrostatic chuck configured to support the wafer, wherein the process chamber is coupled to DC ground.

5. The apparatus of claim 4, wherein the process chamber further comprises:
wherein the hollow cylinder is conductive and RF hot; and
an outer hollow cylinder acting as a DC ground, coupled to the single monolithic top electrode.

6. The apparatus of claim 1, wherein at least one of the one or more VHF sources generates a signal with a frequency of approximately greater than 30 MHz and the two or more frequency signals have frequencies less than 4 MHz.

7. The apparatus of claim 1, wherein a first frequency generator of the two or more frequency generators generates a signal with a frequency of 2 MHz and a second frequency generator of the two or more frequency generators generates a signal with a frequency of 400 kHz.

8. The apparatus of claim 1, wherein one signal of the two or more frequency signals has a frequency that is a harmonic of a frequency of another signal of the two or more frequency signals.

9. The apparatus of claim 1, further comprising a high voltage probe coupled to the bottom electrode.

10. A method for plasma processing comprising:
processing a wafer using a process chamber with a single monolithic top electrode, the single monolithic top electrode positioned centrally within the process chamber above a bottom electrode;

providing one or more very high frequency (VHF) signals with one or more VHF sources to the single monolithic top electrode of the process chamber via symmetrical conductors connected to a top edge of a hollow cylinder which has a bottom edge connected to the single monolithic top electrode; and providing two or more frequency signals having frequencies less than the one or more VHF signals with two or more frequency generators to the bottom electrode of the process chamber, wherein the single monolithic top electrode is DC grounded to the process chamber such that a symmetrical low impedance current return path for the two or more frequency signals is provided by the symmetrical conductors.

11. The method of claim 10, further comprising:
impedance matching the one or more VHF sources and the process chamber using a VHF match; and
impedance matching the bottom electrode and the two or more frequency generators using, respectively, two or more frequency matches.

12. The method of claim 11, further comprising:
isolating the two or more frequencies respectively using two or more isolators, each isolator of the two or more isolators is positioned directly between one of the two or more frequency matches and the bottom electrode and removes frequencies not supplied directly to the isolator by one of the two or more frequency generators.

13. The method of claim 11, wherein the process chamber further comprises:
the symmetrical conductors are coupled to the VHF match;
and
an electrostatic chuck configured to support the wafer, wherein the process chamber is coupled to DC ground.

14. The method of claim 13, wherein the process chamber further comprises:
wherein the hollow cylinder is conductive and RF hot; and
an outer hollow cylinder acting as a DC ground, coupled to the single monolithic top electrode.

15. The method of claim 10, wherein the two or more frequency signals have frequencies that are less than 4 MHz.

16. The method of claim 10, further comprising:
generating a signal with a VHF of approximately greater than 30 MHz; and
generating a first signal with a first frequency of 2 MHz and a second signal with a second frequency of 400 kHz as frequencies of the two or more frequency signals.

17. An apparatus for plasma processing, comprising:
a controller;
a process chamber with a symmetrical plasma source configured to process a wafer with a single monolithic top electrode, the single monolithic top electrode positioned centrally within the process chamber above a bottom electrode;
one or more very high frequency (VHF) sources, coupled to the single monolithic top electrode via symmetrical conductors connected to a top edge of a hollow cylinder which has a bottom edge connected to the single monolithic top electrode, to generate plasma density;
two or more isolators for isolating particular frequencies coupled to a bottom electrode of the process chamber;
two or more frequency matches coupled respectively, to the two or more isolators; and
two or more frequency generators that each generate a signal with frequencies less than 4 MHz, coupled respectively to the two or more frequency matches, the two or more frequency generators configured to dissipate energy in a plasma sheath above the bottom electrode, wherein the controller controls the one or more VHF sources to generate a VHF signal with a frequency greater than 30 MHz and controls the two or more frequency generators to generate two or more frequency signals, and
wherein the single monolithic top electrode is DC grounded to the process chamber such that a symmetrical low impedance current return path for the two or more frequency signals is provided by the symmetrical conductors.

18. The apparatus of claim 17, wherein a first frequency generator of the two or more frequency generators generates a signal with a frequency of 2 MHz and a second frequency generator of the two or more frequency generators generates a signal with a frequency of 400 kHz.

19. The apparatus of claim 17, further comprising:
wherein the symmetrical conductors are coupled to the one or more VHF sources; and
an electrostatic chuck configured to support the wafer, wherein the process chamber is coupled to DC ground.

20. The apparatus of claim 19, wherein the process chamber further comprises:
wherein the hollow cylinder is conductive and RF hot; and
an outer hollow cylinder acting as a DC ground, coupled to the single monolithic top electrode.

* * * * *

UNITED STATES PATENT AND TRADEMARK OFFICE
CERTIFICATE OF CORRECTION

PATENT NO.         : 10,395,896 B2
APPLICATION NO.    : 15/449456
DATED              : August 27, 2019
INVENTOR(S)        : Lee et al.

Page 1 of 1

It is certified that error appears in the above-identified patent and that said Letters Patent is hereby corrected as shown below:

In the Claims

In Claim 3, Column 8, Line 36, delete "low" from "two or more low frequency matches".

Signed and Sealed this
Fifteenth Day of October, 2019

Andrei Iancu
*Director of the United States Patent and Trademark Office*